United States Patent [19]

Kubota et al.

[11] Patent Number: 4,774,464
[45] Date of Patent: Sep. 27, 1988

[54] MAGNETIC ROTARY SENSOR FOR DETECTING ABSOLUTE POSITION OF ROTATING BODY

[75] Inventors: Masanori Kubota, Nakaminato; Yoshikazu Hoshi, Toukai, both of Japan

[73] Assignees: Hitachi Ltd.; Hitachi Automotive Eng. Co., both of Tokyo, Japan

[21] Appl. No.: 4,622

[22] Filed: Jan. 20, 1987

[30] Foreign Application Priority Data

Jan. 20, 1986 [JP] Japan .................................. 61-7942

[51] Int. Cl.$^4$ .......................... G01B 7/30; H03M 1/00; G06K 7/08
[52] U.S. Cl. ...................................... 324/208; 341/9; 341/15
[58] Field of Search ............... 324/173, 174, 207, 208, 324/252; 235/449, 493; 123/617; 340/347 P

[56] References Cited

U.S. PATENT DOCUMENTS

| | | | |
|---|---|---|---|
| 4,274,053 | 6/1981 | Ito et al. ............................. | 324/174 |
| 4,589,038 | 5/1986 | Radtke ............................ | 324/252 X |
| 4,599,561 | 7/1986 | Takahashi et al. ............. | 324/252 X |
| 4,616,281 | 10/1986 | Nakamura ....................... | 324/252 X |
| 4,677,377 | 6/1987 | Takahashi et al. ................... | 324/208 |
| 4,694,688 | 9/1987 | Takahashi et al. ............. | 324/208 X |
| 4,707,695 | 11/1987 | Takahashi et al. ............. | 324/208 X |
| 4,713,613 | 12/1987 | Takahashi et al. ................... | 324/208 |

FOREIGN PATENT DOCUMENTS

216899 6/1984 Japan .

Primary Examiner—Gerard R. Strecker
Attorney, Agent, or Firm—Antonelli, Terry & Wands

[57] ABSTRACT

A magnetic rotary sensor has a rotary drum carrying thereon magnetically recorded codes representative of discrete positions obtained by dividing one rotation of the drum into a predetermined number of positions. Further, an interval between the adjacent discrete positions identified by the codes is interpolated by interpolation signals generated on the basis of a sine wave signal and a cosine wave signal, which are so produced by magnetic signals additionally recorded on the drum that the periods thereof correspond to the interval. Accordingly, a magnetic rotary sensor can be realized, which is capable of identifying the rotational positions of a rotating body with high resolution without increasing the rotary drum in size.

7 Claims, 6 Drawing Sheets

MAGNETIC ROTARY SENSOR FOR DETECTING ABSOLUTE POSITION OF ROTATING BODY

BACKGROUND OF THE INVENTION

1. Field of the Invention

The present invention relates to a magnetic rotary sensor which detects the absolute positions of the rotation of a rotating body, particularly to a magnetic rotary sensor of the absolute type, which is capable of remarkably improving the resolving power in the detection of the rotational positions of a rotating body.

2. Description of the Related Art

Generally, a magnetic rotary sensor of the absolute type comprises a rotary drum or disc attached to and rotating with a rotating body, on which drum or disc magnetic signals are recorded, and a magnetic sensor composed of magnetoresistive elements and disposed to face a recording portion of the rotary drum or disc. With this arrangement, particular rotational positions of the rotating body can be identified by detecting the magnetic signals by the magnetic sensor, without referring to any reference point. In this case, the output signal of the magnetic sensor is in the form of a digital signal, which represents respective rotational position obtained by equally dividing one rotation of the rotary drum or disc into a predetermined number of positions.

According to the U.S. patent application Ser. No. 560,178 filed on Dec. 12, 1983 and assigned to the same assignee as this application, the recording portion of a rotary drum, which is formed by magnetic material attached on the cylindrical surface of the drum, is divided into plural tracks in the rotational direction of the drum, along which the magnetic signals are recorded in such a manner that codes are formed in the axial direction of the drum. These codes are the digital signals representing the particular positions. The plural tracks are paired, and one pair of the tracks is assigned to record a magnetic signal for one digit of the digital signals.

In the prior art as mentioned above, the minimum interval of the rotational positions to be detected, i.e., the resolving power of a magnetic rotary sensor, is limited by the number of bits of the codes prepared for representing the rotational positions to be detected. If the higher resolving power is required for a magnetic rotary sensor, the number of bits of the codes must be increased by increasing the number of the tracks provided on the recording portion of the drum, with the result that the drum, and hence the magnetic rotary sensor, becomes large in size.

SUMMARY OF THE INVENTION

An object of the present invention is to improve the resolution of the magnetic rotary sensor of the type, in which there are comprised rotary means carrying thereon magnetically recorded codes representative of discrete positions (primary positions) obtained by dividing one rotation of the rotary means into a predetermined number of positions, and magnetic sensing means for detecting signals corresponding to the codes, whereby the absolute positions of the rotation of a rotating body can be identified.

A feature of the present invention is in that there are further provided, in the magnetic rotary sensor, means for generating two auxiliary signals in accordance with the rotation of the rotary means. The two auxiliary signals periodically alter their magnitudes, a period of each of which corresponds to an interval between two adjacent primary positions, and one of which auxiliary signals is shifted by a predetermined phase difference from the other auxiliary signal. On the basis of the relationship between the magnitudes of the two auxiliary signals, interpolation signals are produced, which represent rotational positions intervening between the adjacent primary positions.

According to the present invention, there can be realized a magnetic rotary sensor capable of identifying the rotational position of a rotating body with the high resolution without increasing rotary means, such as a rotary drum or disc, in size.

BRIEF DESCRIPTION OF THE DRAWINGS

FIGS. 4a to 4h are drawings for explaining the operation of the interpolation function of the magnetic rotary sensor shown in FIG. 1;

DESCRIPTION OF THE PREFERRED EMBODIMENT

Figure 1:
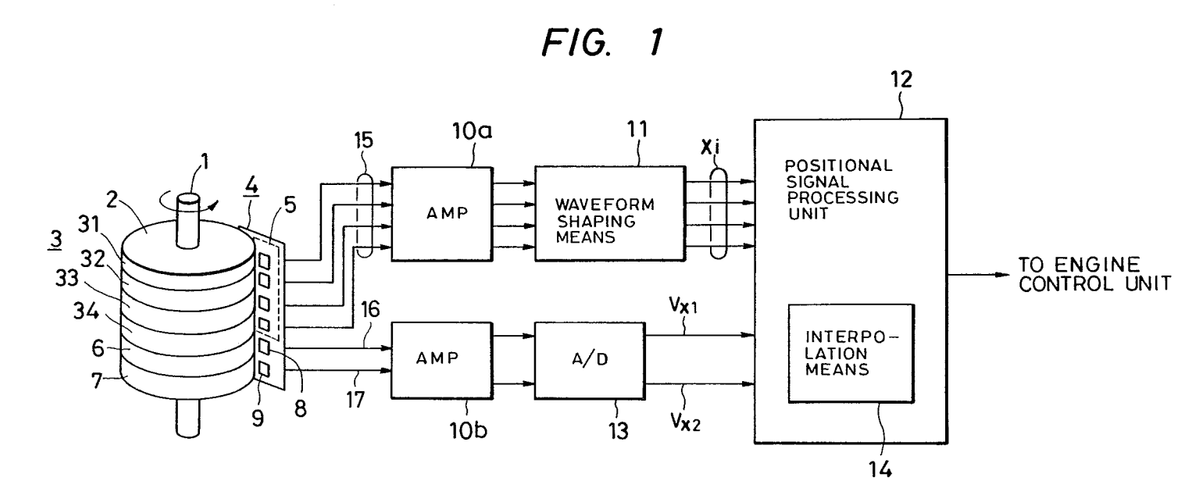
FIG. 1 is a schematic block diagram showing a magnetic rotary sensor according to an embodiment of the present invention.

In FIG. 1 showing a block diagram of a magnetic rotary sensor according to an embodiment of the present invention, an axle 1 is coupled to a rotating body, the rotational positions of which are to be detected. Rotary means 2, i.e. a rotary drum in this case, is coupled to and rotates with the axle 1. On the cylindrical surface of the drum 2 is provided magnetic material.

The portion provided with the magnetic material functions as a recording portion 3. This portion 3 is divided into plural tracks in the rotational direction of the drum 2. Incidentally, in the case where a rotary disc is used as the rotary means in place of the drum 2, the surface of the disc is devoted to the recording portion, and the plural tracks are provided on the disc surface along the different circumferences thereof.

In the embodiment shown, the recording portion 3 is divided into eight tracks, which are paired to form four track pairs. They are shown as four pairs 31 to 34 in the figure. On a supporting member 4, there are provided four sensing units generally shown by a broken line 5. Each unit faces the corresponding track pairs 31 to 34.

In this embodiment, a digital signal of four bits is used in order to indicate a particular rotational position, and each track pair corresponds to one digit of the four-bit digital signal. Therefore, a rotational position can be detected at every one-sixteenth of one rotation of the drum 2, if an ordinary binary code system is adopted for the digital signal, and at every one-thirty-second of one rotation of the drum 2, if a gray code system is used for the digital signal. In the following, the case of the gray code will be described. Therefore, the sensing unit 5 produces a four-bit digital signal 15, which indicates a particular position obtained by dividing one rotation of the drum 2 into thirty-two. For convenience sake, the position identified by this digital signal is called a primary position, hereinafter.

In the recording portion 3, there are provided additional tracks 6, 7, and on the supporting member 4, there are two additional sensing units 8, 9, which face the additional tracks 6, 7, respectively. Although the details will be described later, the sensing units 8, 9 detect the magnetic signals recorded on the tracks 6, 7 and produce respective output signals 16, 17; a sine wave and a cosine wave, for example. Since the two output signals are sufficient to have the phase difference of $\lambda/4$ from each other, the sensing unit 8 may produce a sine wave, if the sensing unit 9 outputs a cosine wave, and vice versa. Here let's assume that the sensing unit 8 produces a cosine wave 16 and the sensing unit 9 a sine wave 17.

The signal 15 produced by the sensing unit 5 is coupled to an amplifier 10a and then shaped in a waveform shaping means 11, so that a well shaped digital signal $X_i$ of four bits can be obtained. On the other hand, the signals 16, 17 output from the respective sensing units 8, 9 are amplified by an amplifier 10b and then converted into digital signals $V_{x1}$ and $V_{x2}$ by an analog-to-digital (A/D) converter 13.

The thus obtained signals $X_i$, $V_{x1}$ and $V_{x2}$ are taken into a processing unit 12 executing the processing for the detection of the primary rotational positions. The processing unit 12 includes interpolation means 14, which characterizes the magnetic rotary sensor of the present invention, and the function of which will be described in detail later. In case the magnetic rotary sensor of the present invention is applied to a crank angle sensor of an internal combustion engine, for example, the output signal of the processing unit 12 is led to and used in a known engine control unit as a crank angle signal.

Figure 2A:
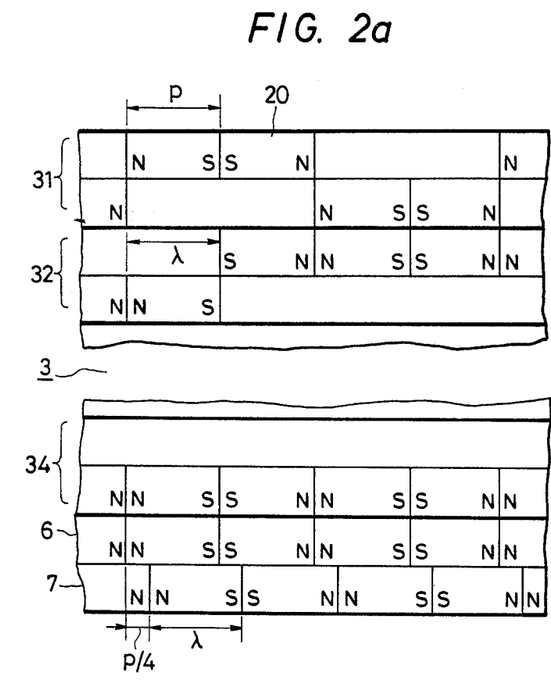
FIGS. 2a to 2e show a pattern of the magnetic signals recorded on a rotary drum, a detailed arrangement of magnetoresistive elements of a magnetic sensor facing the rotary drum, and circuits for deriving signals from the magnetoresistive elements.

FIG. 2a shows the state of the magnetic signals recorded on the recording portion 3 of the drum 2. On every track the magnetic signals are recorded with the predetermined number of unit magnets 20, each of which has a pitch p, i.e., the distance between N and S poles thereof. The track pair 31 for a $2^0$ bit (least significant digit; LSD) of the four-iit digital signal, for example, is composed of two tracks, each of which is recorded with the magnetic signals consisting of two unit magnets. Therefore, the length of one of the magnetic signals for LSD is 2p. The magnetic signals on one of the two tracks has the phase difference of 180° from those on the other track.

The track pair 32 for a $2^1$ bit of the four-bit digital signal also has two tracks, each of which is recorded with themagnetic signals consisting of four unit magnets. Therefore, the length of one of the magnetic signals for this bit is 4p, and these magnetic signals are shifted by $\lambda$, which is half the length of the magnetic signals for LSD. In this case, since every magnetic signal for LSD is composed of two unit magnets, the phase difference $\lambda$ between the $2^0$ and the $2^1$ bits becomes equal to the pitch p of the unit magnet. Further, also in this track pair 32, the magnetic signals on one of the two tracks has the phase difference of 180° from those on the other track.

Similarly, the track pair 34 for a $2^3$ bit (most significant digit; MSD) of the four-bit digital signal is made up of sixteen unit magnets. Although only a part thereof is shown in the figure, the way of constructing the track pair is quite the same as that of other track pairs as mentioned above. The track pair 33 for a $2^2$ bit of the four bit digital signal, although it is omitted in FIG. 2a, is formed of eight unit magnets arranged in a similar way to those for other digits.

In this manner, the gray codes are constructed in the axial direction of the drum 2 (in the longitudinal direction in the drawing) by shifting the magnetic signals of a certain bit of the digital signal by half the length of the magnetic signals of the bit, which is by one digit less in the significancy than the certain bit. Further, in the case where a rotary disc is used in place of the drum 2, the tracks as mentioned above are formed along the dfferent circumferences, so that the gray codes are constructed in the radius direction of the disc. Generally, in both cases, the codes representing the primary positions are constructed in the direction perpendicular to the rotational direction of the rotary means. Since, however, the construction for detecting the primary positions has no particular relation with the essence of the present invention, the further description thereof is omitted.

Figure 2B:
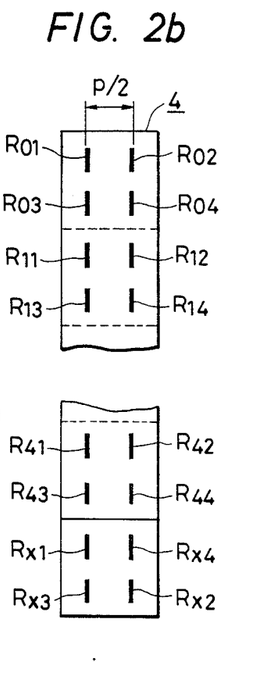

FIG. 2b shows the detailed arrangement of the magnetic sensing units. A magnetic sensing unit is formed by magnetoresistive elements, which, as is well known, vary their electric resistance in response to the intensity of the magnetic field applied thereto. On the supporting member 4, magnetoresistive elements $R_{01}$, $R_{02}$, $R_{03}$ and $R_{04}$ are provided to form the sensing unit for the $2^0$ bit of a four-bit digital signal representing the primary positions. The magnetoresistive elements $R_{01}$ and $R_{02}$ face one track of the track pair 31, and the magnetoresistive elements $R_{03}$ and $R_{04}$ face the other track thereof. Further, the magnetoresistive elements $R_{01}$ and $R_{03}$ are spaced by p/2 from the magnetoresistive elements $R_{02}$ and $R_{04}$. Magnetic sensing units for the remaining bits $2^1$, $2^2$ and $2^3$ of the four-bit digital signal, which face the track pairs 32 to 34, respectively, are constructed in the same manner as that for the $2^0$ bit.

In the recording portion 3 of the drum 2, as already described, there are provided the additional tracks 6, 7, which are recorded with the magnetic signals in the following manner. On the track 6, the magnetic signals are recorded with the unit magnets of the pitch p throughout the circumference of the track. In this embodiment, the unit magnets are so arranged on the track 6 that they are synchronized with those of the track pair 31 for LSD. Namely, as shown in the figure, the end of every unit magnet on the track 6 coincides with the end of a certain magnetic signal on the track pair 31 for LSD.

The magnetic signals recorded on the track 7 are shifted by $\lambda/4$ with respect to the magnetic signals recorded on the track 6. This shift between both the magnetic signals are relative. Therefore, the magnetic signals on the track 7 can be made in synchronism with those on the track pair 31 and the magnetic signals on the track 6 can have the phase difference of $\lambda/4$ from those of the track 7.

Facing the tracks 6, 7, additional magnetic sensing units consisting of magnetoresistive elements $R_{x1}$ to $R_{x4}$ are provided in the same manner as the magnetic sensing units facing the track pairs 31 to 34. However, in this case, one sensing unit is composed of two magnetoresistive elements; namely, the magnetoresistive elements $R_{x1}$ and $R_{x4}$ form the sensing unit 8 and the magnetoresistive elements $R_{x3}$ and $R_{x2}$ form the sensing unit 9.

Figure 2C:
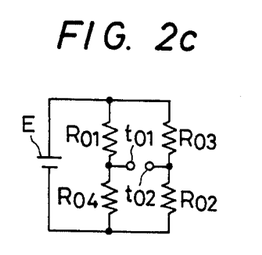
Figure 2D:
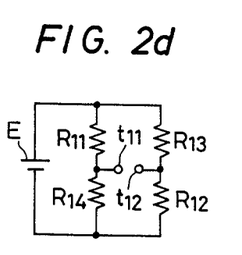
Figure 2E:
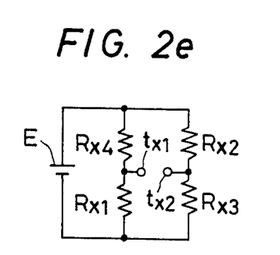

The magnetoresistive elements $R_{01}$ to $R_{44}$ and $R_{x1}$ to $R_{x4}$ are connected to form bridge circuits as shown in FIGS. 2c to 2e. In the figures, there are shown only the bridge circuits for the track pairs 31 and 32 and the tracks 6, 7. The bridge circuits for the remaining track pairs 33 and 34 are formed in the same manner. These bridge circuits are fed by a DC source E and their outputs are derived from terminals $t_{01}$ and $t_{02}$, $t_{11}$ and $t_{12}$, and $t_{x1}$ and $t_{x2}$.

Figure 3A:
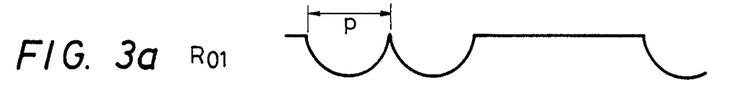
FIGS. 3a to 3n are drawings for explaining the operation of the magnetic rotary sensor shown in FIG. 1.
Figures 3B, 3C, 3D:
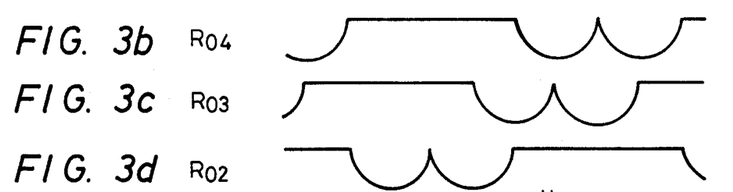
Figure 3E:
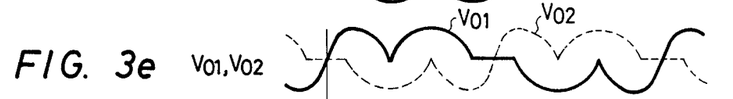
Figure 3F:
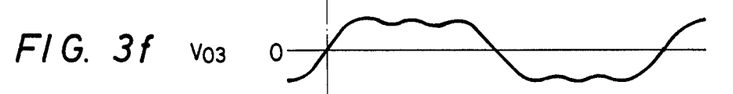
Figures 3G, 3H:
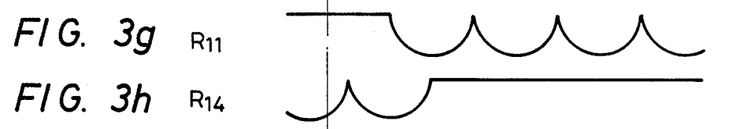
Figure 3I:
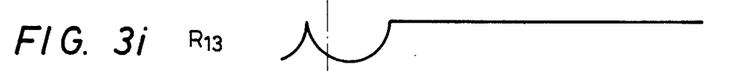
Figure 3J:
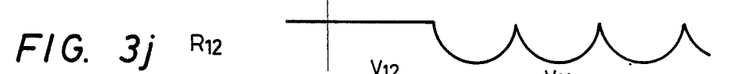
Figure 3K:
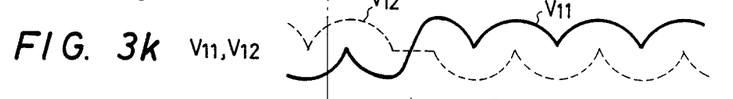
Figure 3L:
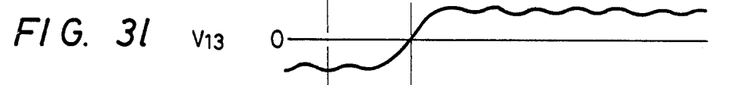
Figure 3M:
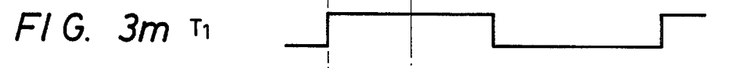

Referring next to FIGS 3a to 3n, the explanation will be made of the operation of detection of the primary positions. When the track pair 31 moves, facing the magnetoresistive elements $R_{01}$ to $R_{04}$, the resistance values thereof change as shown in FIGS. 3a to 3d. As a result, the voltage $V_{01}$ as shown by a solid line in FIG. 3e appears at the terminal $t_{01}$, and the voltage $V_{02}$ as shown by a broken line in the same figure appears at the terminal $t_{02}$. Consequently, the voltage $V_{03}$ as shown in FIG. 3f appears across the terminals $t_{01}$ and $t_{02}$. This voltage $V_{03}$ is shaped by the waveform shaping means 11 to become a rectangular wave signal $T_1$ as shown in FIG. 3m, which is the signal for the $2^0$ bit of the four bit digital signal representing the primary positions.

Figure 3N:
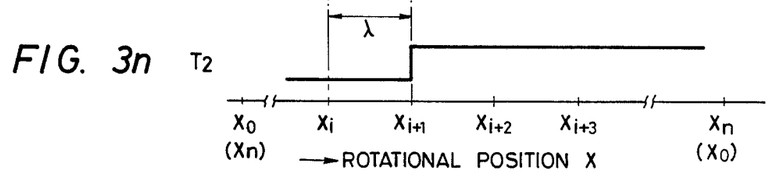

Similarly, the resistance values of the magnetoresistive elements $R_{11}$ to $R_{14}$ facing the track pair 32 change as shown in FIGS. 3g to 3j. Accordingly, the voltage $V_{11}$ as shown by a solid line in FIG. 3k appears at the terminal $t_{11}$, and the voltage $V_{12}$ as shown by a broken line in the same figure appears at the terminal $t_{12}$. Therefore, the voltage $V_{13}$ as shown in FIG. 3l appears across the terminals $t_{11}$ and $t_{12}$. This voltage $V_{13}$ is shaped by the waveform shaping means 11 to become a rectangular wave signal $T_2$ as shown in FIG. 3n, which is the signal for the $2^1$ bit of the four-bit digital signal.

Although rectangular wave signals for the $2^2$ and the $2^3$ bits of the four-bit digital signal are generated in the similar manner by the cooperation of the track pairs 33, 34 and the corresponding sensing units, the description of the generation of those signals is omitted, because the generation of the signal for LSD is most important and the signals of the more significant digits has no particular meaning, for the present invention.

Here it is to be noted that, between the leading edge of the $2^0$ bit signal $T_1$ and that of the $2^1$ bit signal $T_2$, there is the difference $\lambda$ caused by the phase difference in the arrangement of the magnetic signals on the track pairs 31, 32 (cf. FIG. 2a). This difference means the minimum interval of the rotational positions which can be detected as the primary positions. As will be understood from the figure, the two less significant digits of the four-bit digital signal for the rotational position $X_i$ are represented by "01", and those for the rotational position $X_{i+1}$ by "11", for example.

In this way, the discrete rotational positions, i.e. the primary positions, obtained by dividing one rotation of the drum 2 into thirty-two can be identified by the gray codes particularly assigned to the respective positions. Therefore, the discriminating minimum interval of the rotational positions corresponds to the phase difference $\lambda$ between the $2^0$ bit signal $T_1$ and the $2^1$ bit L signal $T_2$, which is equal to half the length of the magnetic signals recorded on the track pair 31 for LSD. Incidentally, also in the case of the ordinal binary code system, the discriminating minimum interval is limited by the length of the magnetic signals recorded on the track for LSD, although the details are omitted here.

With the drum 2 bearing the track pairs as constructed above, however, the rotational positions, which are obtained by dividing one rotation of the drum 2 more finely than the minimum interval $\lambda$, can not be discriminated. Then, the present embodiment has means for interpolating an interval between the primary positions. The tracks 6, 7 and the sensing units 8, 9 generate the signals for that purpose. FIGS. 4a to 4h are drawings showing various waveforms for explaining the operation of the tracks 6, 7 and the sensing units 8, 9.

Figure 4A:
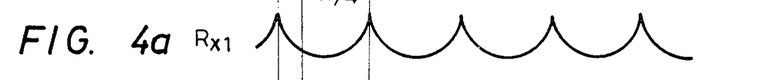
Figure 4B:
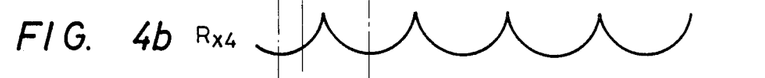

As of the drum 2 rotates, the resistance values of the magnetoresistive elements $R_{x1}$ and $R_{x4}$ change as shown in FIGS. 4a and 4b. These resistance values change with the phase difference of p/2, which is equal to the difference in the space between the magnetoresistive elements $R_{x1}$ and $R_{x4}$ (cf. FIG. 2b). As a result, the voltage $V_{x1}$ as shown in FIG. 4c appears at the terminal $t_{x1}$ (cf. FIG. 2e) with respect to ground.

Figure 4C:
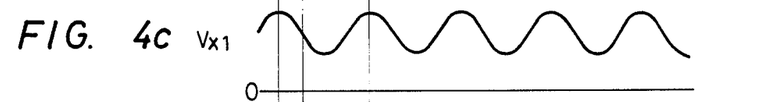
Figure 4D:
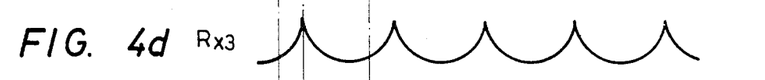
Figure 4E:
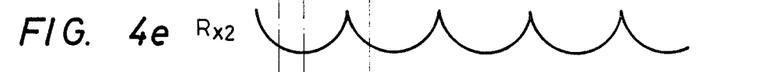

On the other hand, as the drum 2 rotates, the resistance values of the magnetoresistive elements $R_{x3}$ and $R_{x2}$ change as shown in FIGS. 4d and 4e. Similarly to the relation of the waves as shown in FIGS. 4a and 4b, these resistance values $R_{x3}$ and $R_{x2}$ change with the phase difference of p/2, which is equal to the difference in the space between the magnetoresistive elements $R_{x3}$ and $R_{x2}$ (cf. FIG. 2b). As a result, the voltage $V_{x2}$ as shown in FIG. 4f appears at the terminal $t_{x2}$ (cf. FIG. 2e) with respect to ground.

Figure 4F:
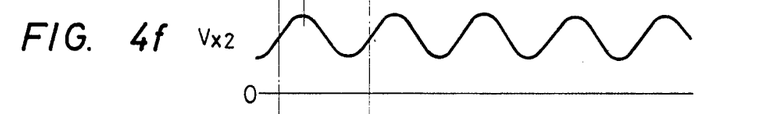
Figure 4G:
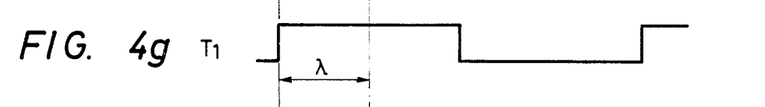
Figure 4H:
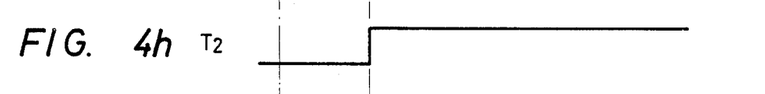

As apparent from the figures, the signals $V_{x1}$ and $V_{x2}$ shown in FIGS. 4c and 4f have the phase difference of $\lambda/4$, which is caused by the phase difference in the arrangement of the magnetic signals recorded on the tracks 6, 7 (cf. FIG. 2a), and one cycle of both the signals $V_{x1}$ and $V_{x2}$ is equal to the interval $\lambda$ between the adjacent primary positions. Further, taking the leading edge of the $2^0$ bit signal $T_1$ as the reference point, the signal $V_{x1}$ of FIG. 4c can be considered as the cosine wave (the signal 16 in FIG. 1) and the signal $V_{x2}$ of FIG. 4f as the sine wave (the signal 17 in FIG. 1).

These output voltages from the sensing units 8, 9 are amplified by the amplifier 10b. The gain of the amplifier 10b is selected at the very large value. For example, the gain of the amplifier 10a is as relatively small as 10, whereas that of the amplifier 10b is as large as 100. This is because the linearly changing portion of the signals of the sine and the cosine waves can be extended. The outputs of the amplifier 10b are led to the A/D converter 13 and converted into the digital value. Therefore, in the following explanation, the signals $V_{x1}$ and $V_{x2}$ should be regarded as the digital amount.

Figure 5:
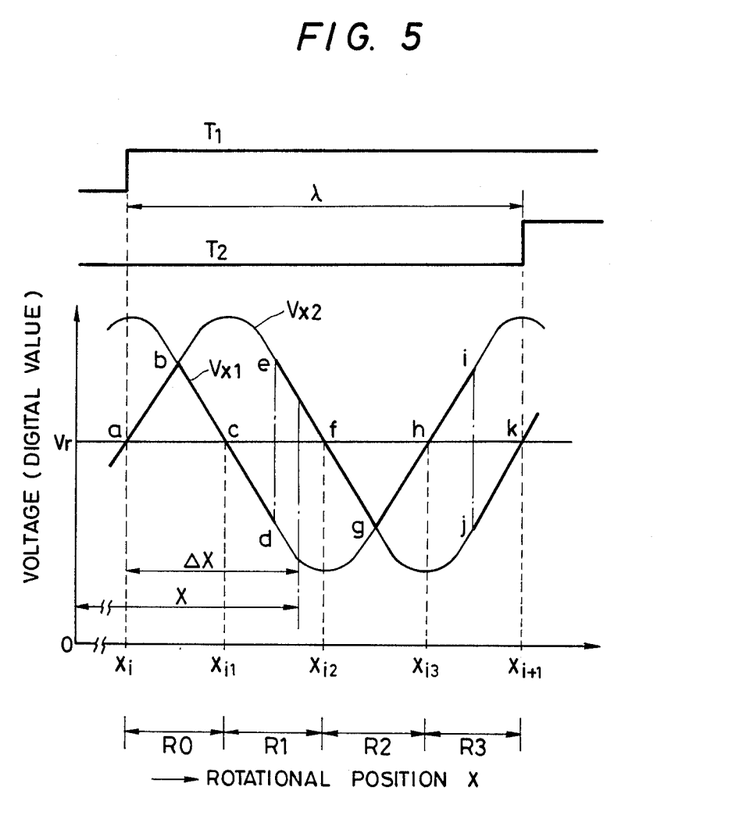
FIG. 5 is a drawing for explaining the principle of the interpolation function of the magnetic rotary sensor of FIG. 1.
Figure 6:
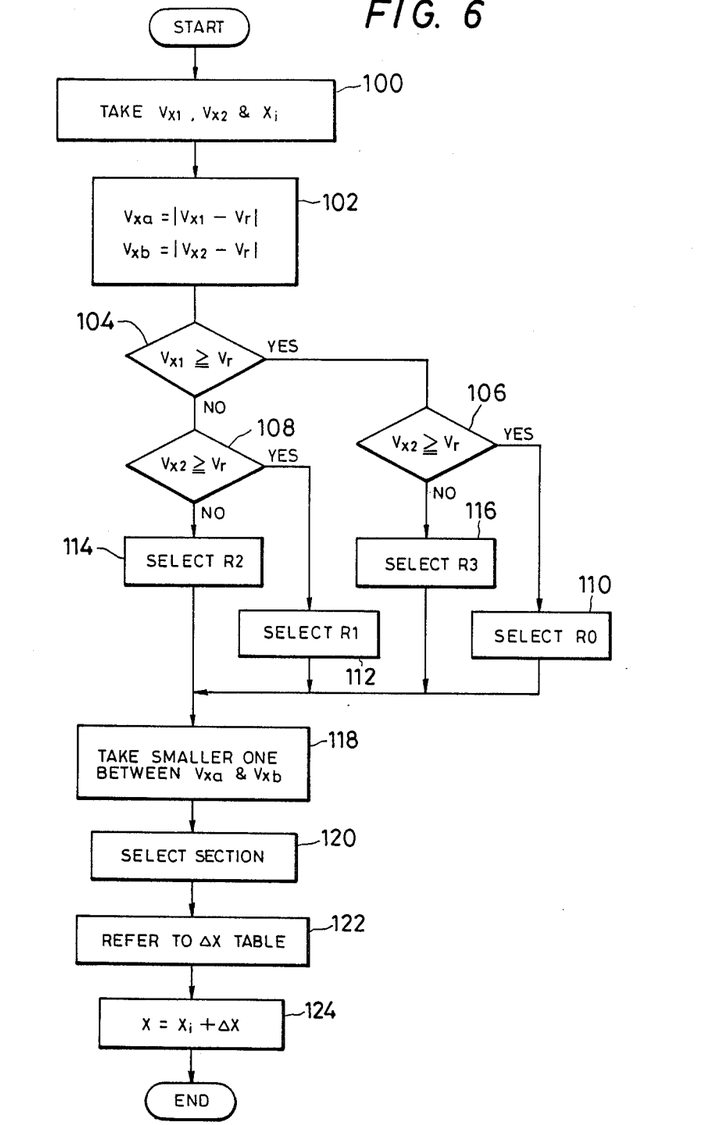
FIG. 6 is a flow chart showing the processing of the interpolation function, which is executed by a microcomputer used in the magnetic rotary sensor of FIG. 1.

Next referring to FIG. 5, in which the signals $V_{x1}$ and $V_{x2}$ are shown in the expanded form, and to FIG. 6 showing a flow chart of the processing of the interpolation function conducted by the interpolation means 14, the explanation will be made of the principle and the operation of the interpolation between the primary positions $X_i$ and $X_{i+1}$.

As already described, the signals $V_{x1}$ and $V_{x2}$ change with the period $\lambda$, and therefore, the interval between the primary positions $X_i$ and $X_{i+1}$ can be interpolated by using the changing amount of the signals $V_{x1}$ and $V_{x2}$. More particularly, the signals $V_{x1}$ and $V_{x2}$ have portions, as shown by thick solid lines in FIG. 5, in which the changing amount is made sufficiently linear due to the large gain of the amplifier 10b. A present rotational position X between the primary positions $X_i$ and $X_{i+1}$ can be identified by knowing $X_i$ and the distance $\Delta X$ from $X_i$.

Then, at step 100 of the flow chart of FIG. 6, $V_{x1}$, $V_{x2}$ and $X_i$ are taken into the processing unit 12. In the flow of this embodiment, step 102 is executed after step 100, in which there are obtained the absolute values $V_{xa}$ and $V_{xb}$ of the magnitudes of $V_{x1}$ and $V_{x2}$ with respect to the reference value $V_r$. However, the values $V_{xa}$ and $V_{xb}$ obtained at this step are used later.

As apparent from FIG. 5, the respective signals $V_{x1}$ and $V_{x2}$ can have the same values with respect to the different rotational positions. However, the respective positions are distinguished from each other by discriminating regions R0 to R3. With respect to the signal $V_{x2}$, for example, the position corresponding to the point b belongs to the region R0, but the position corresponding to the point e, which has the value equal to the point b, is included in the region R1.

This discrimination of the region is conducted at steps 104 to 108. If both $V_{x1}$ and $V_{x2}$ are equal to or larger than the reference $V_r$, the region R0 is selected (step 110). When $V_{x1}$ is smaller than $V_r$ and $V_{x2}$ is equal to or larger than $V_r$, the region R1 is selected (step 112). If both $V_{x1}$ and $V_{x2}$ are smaller than $V_r$, the region R2 is selected (step 114). In case $V_{x1}$ is equal to or larger than $V_r$ and $V_{x2}$ is smaller than $V_r$, then the region R3 is selected (step 116).

Here it is to be noted that the rough interpolation can be already performed by selection of the regions R0 to R3, namely, the space between $X_i$ and $X_{i+1}$ can be interpolated by three intervening positions $X_{i1}$, $X_{i2}$ and $X_{i3}$. This means that the rotational position can be detected with four times the accuracy or fineness, compared with the detection of the rotational positions by the primary position signals only.

In the following steps, the detection of the rotational positions can be achieved with the further accuracy or fineness. At first, the smaller one of the absolute values $V_{xa}$ and $V_{xb}$ is taken at step 118. This is because one of two sections included in one region is identified at step 120. Namely, the region R0 includes the sections ab and bc, and the region R1 includes the sections cd and ef. The same is applied to the remaining regions R2 and R3, which include the sections fg and gh, and hi and jk, respectively. In the region R0, for example, if $V_{xa}$ is larger than $V_{xb}$, the section ab is selected, and if $V_{xa}$ is smaller than $V_{xb}$, then the section bc is selected.

By selecting one of the sections ab to jk, the intervals between $X_i$ and $X_{i1}$, $X_{i1}$ and $X_{i2}$, $X_{i2}$ and $X_{i3}$, and $X_{i3}$ and $X_{i+1}$ are further interpolated with one additional intervening position. Therefore, the rotational positions can be detected with eight times the accuracy of fineness, compared with the detection by the primary position signals only; namely the accuracy or fineness of the detection is enhanced up to the minimum interval of the rotational position which is obtained by dividing one rotation of the drum 2 into 256 (32×8).

In order to further improve the accuracy or fineness of the detection, an interpolation table is employed in this embodiment. The interpolation table stores data of the distance $\Delta X$ measured from the primary position $X_i$ with respect to the value $V_{xa}$ or $V_{xb}$. Therefore, $\Delta X$ can be retrieved by either $V_{xa}$ or $V_{xb}$ which is selected at step 118 (cf. step 122). The present rotational position X is obtained by adding the retrieved $\Delta X$ to $X_i$ previously taken at step 100 (cf. step 124). Since the contents of the interpolation table can be prepared with respect to the interval between the rotational positions obtained by arbitrarily dividing the space between $X_i$ and $X_{i+1}$, the interpolation is achieved with the accuracy or fineness as needed.

As described above in connection with the preferred embodiment, according to the present invention, the primary position signals can be interpolated by the necessary number of intervening position signals, so that the accuracy or fineness of the detection of the rotational positions is much enhanced.

We claim:

1. A magnetic rotary sensor for identifying absolute positions of rotation of a rotating body, comprising:

rotary means coupled with the rotating body for rotation therewith, the rotary means including a magnetic recording portion divided into plural tracks extending in the rotational direction of the rotary means, each of the plural tracks having magnetic signals recorded thereon by alternating arranging a magnetized portion of a predetermined length and a non-magnetized portion of the same predetermined length so that codes representing absolute positions are formed in a direction perpendicular to the rotational direction of the rotary means;

magnetic sensing means including plural magnetic sensing units disposed to face corresponding tracks of the rotary means for detecting the magnetic signals recorded on the respective tracks and for producing electric signals in accordance with the recorded magnetic signals as the rotary means rotates;

processing means for processing the electric signals from the magnetic identifying a particular one of primary positions represented by the codes and determined by dividing one rotation of the rotary means into a predetermined number of positions;

the rotary means further including two additional tracks on the magnetic recording portion thereof, the two additional tracks extending in the rotational direction of the rotary means and having magnetic signals consecutively recorded therealong, the signals recorded on one of said additional tracks being phase shifted a predetermined phase difference from the signals recorded on the other of said additional tracks;

the magnetic sensing means including additional sensing units for detecting the magnetic signals recorded on the two additional tracks and for providing two auxiliary signals having said predetermined phase difference from one another and having magnitudes which change sinusoidally in accordance with the rotation of the rotary means, a period of each of the auxiliary signals corresponding to an interval between two adjacent primary positions; and the processing means being responsive to the two auxiliary signals for generating in accordance with the magnitudes of linearly changing portions in the two auxiliary signals an interpolation signal representing one of the rotational positions intervening between the two adjacent primary positions, and for combining the interpolation signal with a signal representing one of the two adjacent primary positions to produce the digital signal for identifying one of the absolute positions of the rotary means.

2. A magnetic rotary sensor according to claim 1, wherein the processing means includes means for discriminating in accordance with the magnitudes of the linearly changing portions in the two auxiliary signals one of four regions determined by dividing an interval between the two adjacent primary positions by four, and for generating the interpolation signal in response to the discriminated region.

3. A magnetic rotary sensor according to claim 2, wherein the processing means further includes means for calculating absolute values of differences of the two auxiliary signals with respect to a predetermined reference value, means for selecting a smaller one of the calculated absolute values, the discriminating means discriminating in accordance with the selected absolute value one of sections determined by dividing one of the regions by two, and generating the interpolation signal in response to the discriminated section.

4. A magnetic rotary sensor according to claim 2, wherein the processing means further includes means for calculating absolute values of differences of the two auxiliary signals with respect to a predetermined reference value, means for selecting a smaller one of the absolute values, and means responsive to the selected absolute value for retrieving position data from a table storing data of positions intervening between two adjacent primary positions with respect to the absolute values and for generating the interpolation signal in accordance therewith.

5. A magnetic rotary sensor for identifying absolute positions of rotation of a rotating body by a digital position signal of a predetermined number of bits, comprising:

rotary means coupled with the rotating body for rotation therewith, the rotary means including a first magnetic recording portion divided into a number of tracks equal to the predetermined number of bits of the digital signal, the tracks extending in the rotational direction of the rotary means and having magnetic signals recorded therealong by arranging alternately magnetized portions each consisting of unit magnets and having a length different in the respective tracks and non-magnetized portions each having the same length as the corresponding magnetized portions so that codes representing the absolute positions are formed in a direction perpendicular to the rotational direction of the rotary means, and a second magnetic recording portion divided into at least two additional tracks having magnetic signals consisting of unit magnets consecutively arranged therealong, the magnetic signals in the respective additional tracks being shifted by a distance from one another in the rotational direction of the rotary means, the shifted distance being determined by the number of additional tracks provided;

magnetic sensing means provided on a stationary member and including a first group of magnetic sensing units facing corresponding tracks of the first magnetic recording portion for detecting the magnetic signals recorded on the tracks of the first magnetic recording portion and for producing main electric signals in accordance therewith, and a second group of magnetic sensing units facing corresponding tracks of the second magnetic recording portion for detecting the magnetic signals recorded thereon and for producing at least two auxiliary electric signals in accordance therewith changing sinusoidally with a predetermined phase difference from one another corresponding to the shifted distance and with a period corresponding to a phase difference between a main electric signal for the least significant digit of the digital signal and a main electric signal for the second least significant digit of the digital signal; and processing means for processing the main electric signals from the first group of the magnetic sensing units to produce a primary digital signal identifying one of primary positions determined by dividing one rotation of the rotary means into a predetermined number of positions, and for processing the auxiliary electric signals to generate in accordance with a relationship of the magnitude of linearly changing portions of the auxiliary signals an interpolation signal representing one of subdivided positions intervening between two adjacent primary positions, and for combining the interpolation signal with the primary digital signal for producing the digital position signal representing a present position of the rotary means.

6. A magnetic rotary sensor according to claim 5, wherein, in the first magnetic recording portion, a magnetic signal for a predetermined digit of the digital position signal is shifted with respect to a magnetic signal for a digit which is one digit less significant than the predetermined digit by a distance equal to half a length of the magnetic signal for the one-digit less significant in the rotational direction of the rotating means.

7. A magnetic rotary sensor according to claim 9, wherein, in the second magnetic recording portion, two additional tracks are provided, the magnetic signals on one of the two additional tracks being shifted from the magnetic signal on the other of the two additional tracks by a distance equal to a quarter of a length of the unit magnet in the rotational direction of the rotary means, whereby an auxiliary electric signal produced by a magnetic sensing unit of the second group of magnetic sensing units facing the one additional tracks is a sine wave and an auxiliary electric signal produced by a magnetic sensing unit of the second group of magnetic sensing units facing the other of the two additional tracks is a cosine wave.

* * * * *